United States Patent
Kyakuno

(10) Patent No.: US 11,658,629 B2
(45) Date of Patent: May 23, 2023

(54) AMPLIFIER CIRCUIT

(71) Applicant: YOKOGAWA ELECTRIC CORPORATION, Tokyo (JP)

(72) Inventor: Toshihiko Kyakuno, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/349,086

(22) Filed: Jun. 16, 2021

(65) Prior Publication Data
US 2021/0399703 A1 Dec. 23, 2021

(30) Foreign Application Priority Data

Jun. 22, 2020 (JP) .............................. JP2020-107257

(51) Int. Cl.
*H03F 3/08* (2006.01)
*H03G 1/00* (2006.01)
*H03F 3/45* (2006.01)

(52) U.S. Cl.
CPC ............. *H03G 1/0047* (2013.01); *H03F 3/45* (2013.01); *H03G 1/0088* (2013.01)

(58) Field of Classification Search
CPC ...... H03G 1/0047; H03G 1/0088; H03G 3/30; H03G 3/3084; H03F 3/45; H03F 2203/45534; H03F 3/087; H03F 3/45475; H03F 3/08; H03F 3/082
USPC .................. 330/59, 308; 250/214 A, 214 AG
See application file for complete search history.

(56) References Cited

U.S. PATENT DOCUMENTS

| 4,055,813 A | | 10/1977 | French |
| 5,955,919 A | * | 9/1999 | Lubbe ................. H03F 3/45475 330/86 |
| 6,137,365 A | * | 10/2000 | Wakairo ................... H03H 7/24 330/282 |

(Continued)

FOREIGN PATENT DOCUMENTS

| JP | S63-78417 U | 5/1988 |
| JP | H05-110370 A | 4/1993 |
| JP | 2001-196877 A | 7/2001 |

OTHER PUBLICATIONS

Notice of Reasons for Refusal issued in corresponding Japanese Application No. 2020-107257 dated Mar. 14, 2023 (6 pages).

*Primary Examiner* — Khanh V Nguyen
(74) *Attorney, Agent, or Firm* — Osha Bergman Watanabe & Burton LLP

(57) ABSTRACT

An amplifier circuit includes: an operational amplifier that includes two input terminals and an output terminal; a voltage-dividing resistor circuit electrically connected to the output terminal and that includes a voltage-dividing terminal that outputs a potential obtained by voltage-dividing a potential of the output terminal and a feedback resistor circuit electrically connected to the voltage-dividing terminal and one of the two input terminals. The voltage-dividing resistor circuit includes a plurality of resistors that each include terminals and a switch. The plurality of resistors includes a first resistor and a second resistor. The first resistor includes a terminal that corresponds to the voltage-dividing terminal. The switch switches, from a first terminal of the first resistor to a second terminal of the second resistor, the terminal that corresponds to the voltage-dividing terminal.

12 Claims, 8 Drawing Sheets

(56) References Cited

U.S. PATENT DOCUMENTS

| | | | |
|---|---|---|---|
| 7,068,107 B2* | 6/2006 | Wang | H03G 1/0088 |
| | | | 330/86 |
| 10,263,581 B2* | 4/2019 | Wan | H03F 3/45475 |
| 2007/0296384 A1* | 12/2007 | Dow | G05F 1/575 |
| | | | 323/284 |
| 2016/0149545 A1* | 5/2016 | Deak | H03F 3/45475 |
| | | | 330/260 |

* cited by examiner

FIG. 2

| Range | S1 | S2 | S3 | S4 | Ra | Rb | Gain |
|---|---|---|---|---|---|---|---|---|
| 1 | B | A | - | A | 1,000 | 1,000 | 0 | 1,000 |
| 2 | B | A | - | B | 1,000 | 100 | 900 | 10,900 |
| 3 | B | B | A | - | 1,000 | 10 | 990 | 100,990 |
| 4 | B | B | B | - | 1,000 | 1 | 999 | 1,000,999 |
| 5 | A | A | - | A | 10,000,000 | 1,000 | 0 | 10,000,000 |
| 6 | A | A | - | B | 10,000,000 | 100 | 900 | 100,000,900 |
| 7 | A | B | A | - | 10,000,000 | 10 | 990 | 1,000,000,990 |
| 8 | A | B | B | - | 10,000,000 | 1 | 999 | 10,000,000,999 |

FIG. 4

| Range | S1 | S2 | S3 | S4 | Rc | Ra | Rb | Gain |
|---|---|---|---|---|---|---|---|---|
| 1 | B | A | B | B | 1,000 | 1,000 | 0 | 1,000 |
| 2 | B | B | B | B | 1,000 | 100 | 900 | 10,900 |
| 3 | B | B | A | B | 1,000 | 100 | 9,900 | 100,900 |
| 4 | B | B | — | A | 1,000 | 100 | 99,900 | 1,099,900 |
| 5 | A | A | B | B | 10,000,000 | 1,000 | 0 | 10,000,000 |
| 6 | A | B | B | B | 10,000,000 | 100 | 900 | 100,000,900 |
| 7 | A | B | A | B | 10,000,000 | 100 | 9,900 | 1,000,009,900 |
| 8 | A | B | — | A | 10,000,000 | 100 | 99,900 | 10,000,099,900 |

FIG. 6

| Range | S1 | S2 | S3 | S4 | Rc | Ra | Rb | Gain |
|---|---|---|---|---|---|---|---|---|
| 1 | B | A | - | - | 1,000 | × | 0 | 1,000 |
| 2 | B | B | A | B | 1,000 | 110 | 990 | 10,990 |
| 3 | B | B | A | A | 1,000 | 10 | 990 | 100,990 |
| 4 | B | B | B | - | 1,000 | - | 990 | 1,000,990 |
| 5 | A | A | - | - | 10,000,000 | × | 0 | 10,000,000 |
| 6 | A | B | A | B | 10,000,000 | 110 | 990 | 100,000,990 |
| 7 | A | B | A | A | 10,000,000 | 10 | 990 | 1,000,000,990 |
| 8 | A | B | B | - | 10,000,000 | - | 990 | 10,000,000,990 |

AMPLIFIER CIRCUIT

BACKGROUND

Technical Field

The present disclosure relates to an amplifier circuit.

Related Art

Using an amplifier to amplify an electric signal photoelectrically converted and output by a photodiode is known (for example, see Patent Literature 1).

PATENT LITERATURE

Patent Literature 1 JP 2001-196877 A

In a device such as a turbidity meter, light emitted from a light-emitting source passes through a liquid to be measured and a photodiode photoelectrically converts this light and outputs an electric signal based on the quantity of light thereof. Current output from a photodiode generally has an extremely large dynamic range such as from around 10 pA (picoamperes, 1 pA=$10^{-12}$ A) to around 1 mA (milliamperes, 1 mA=$10^{-3}$ A).

To accommodate such a wide dynamic range, conventional configurations that amplify electric signals output from a photodiode have a complex and large-scale circuit structure, and therefore need to use a large number of expensive parts.

SUMMARY

One or more embodiments provide an amplifier circuit that can increase dynamic range using a simple structure.

The amplifier circuit according to one or more embodiments includes: an operational amplifier having two input terminals and one output terminal; a voltage-dividing resistor circuit electrically connected to the output terminal, having a voltage-dividing terminal outputting a potential obtained by voltage-dividing a potential of the output terminal; and a feedback resistor circuit electrically connected to the voltage-dividing terminal and one of the input terminals; wherein: the voltage-dividing resistor circuit includes a plurality of resistors and switches; and the switches can switch between terminals corresponding to the voltage-dividing terminal from among the plurality of terminals of the plurality of resistors. Therefore, by changing the resistance of the voltage-dividing resistor circuit using a switch, an amplifier circuit is provided having a large dynamic range using an inexpensive and simple structure.

In the amplifier circuit according to one or more embodiments, the voltage-dividing resistor circuit includes a plurality of switches, and at least one of the plurality of switches can switch between another switch from among the plurality of switches and another circuit element. By doing so, the resistance of the voltage-dividing resistor circuit can be switched to various values using a smaller number of switches.

In the amplifier circuit according to one or more embodiments, at least two resistors from among the plurality of resistors provided in the voltage-dividing resistor circuit are connected in series, and the plurality of switches can switch between terminals corresponding to the voltage-dividing terminal from among the connection terminals of the at least two resistors. For example, all of the plurality of resistors provided in the voltage-dividing resistor circuit are connected in series. By doing so, the resistance of the voltage-dividing resistor circuit can be switched based on the resistance of at least two resistors connected in series.

In the amplifier circuit according to one or more embodiments, the feedback resistor circuit includes a plurality of resistors and a switch capable of switching a resistance of the feedback resistor circuit. For example, the plurality of resistors provided in the feedback resistor circuit are connected in parallel. By doing so, the number of high-resistance resistors required to increase the dynamic range of the gain of the amplifier circuit can be suppressed.

One or more embodiments of the present invention provide an amplifier circuit that can increase dynamic range using a simple structure.

BRIEF DESCRIPTION OF THE DRAWINGS

FIG. 2 is a diagram illustrating an example of gain based on switching details of a switch in the amplifier circuit of FIG. 1.

FIG. 4 is a diagram illustrating an example of gain based on switching details of a switch in the amplifier circuit of FIG. 3.

FIG. 6 is a diagram illustrating an example of gain based on switching details of a switch in the amplifier circuit of FIG. 5.

DETAILED DESCRIPTION

Figure 7:
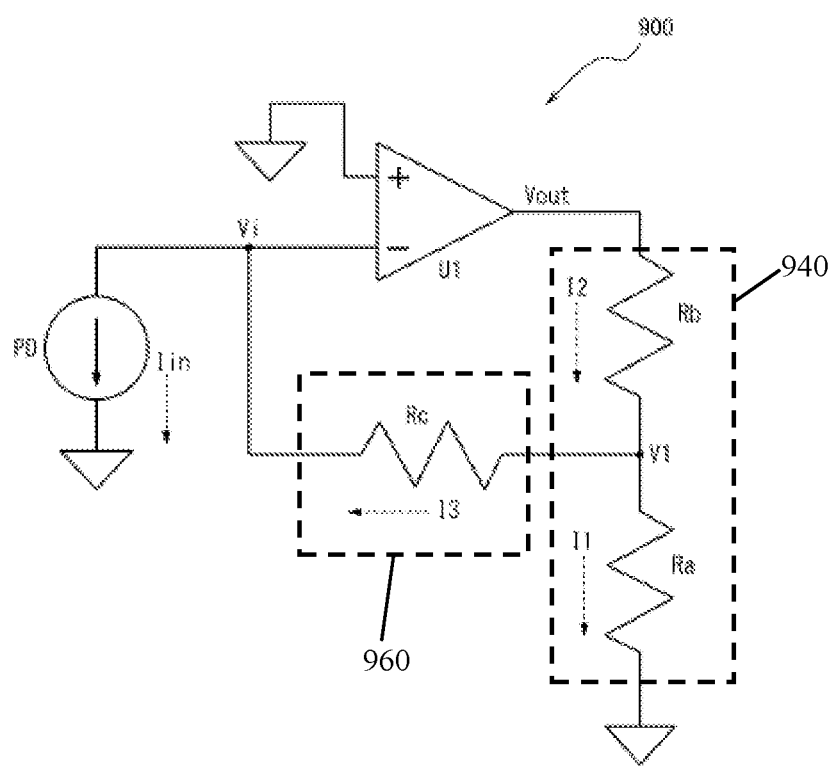
FIG. 7 is a diagram illustrating a circuit configuration of a transimpedance amplifier according to a comparative example.

FIG. 7 is a diagram illustrating a circuit configuration of a transimpedance amplifier (TIA) circuit 900 according to a comparative example. In the example of FIG. 7, a non-inverted input terminal (+ input terminal) of an operational amplifier (operational amplifier) U1 is grounded, and an inverted input terminal (− input terminal) of the operational amplifier U1 is connected to a cathode side of a photodiode PD. In FIG. 7, the photodiode PD is represented as a current source for outputting a current I1. PD is an abbreviation for photodiode.

An output terminal of the operational amplifier U1 is connected to one end of a resistor Rb. The other end of the resistor Rb is connected to one end of a resistor Ra and connected to one end of a resistor Rc. The other end of the resistor Rc is connected to the inverted input terminal of the operational amplifier U1, thereby configuring a negative feedback circuit of the operational amplifier U1. The other end of the resistor Ra is grounded. Hereafter, the resistor Rb and the resistor Ra will also be referred to as "voltage-dividing resistor circuit." The resistor Rc will also be referred to as "feedback resistor circuit." In an example of FIG. 7, the resistor Rb and the resistor Ra may be referred to a voltage-dividing resistor circuit 940 and the resistor Rc may be referred to as the feedback resistor circuit 960.

As illustrated in FIG. 7, the potential of the output terminal of the operational amplifier U1 is Vout. The potential of the inverted input terminal of the operational amplifier U1 is Vi. In a negative feedback circuit such as that in FIG. 7, a feedback signal tracks an input signal, and in the normal state, the input signal and the feedback signal are in a so-called imaginary short-circuit state as though they are shorted (short-circuited). In the imaginary short-circuit state, Vi=0 because the potential difference between the potential Vi in the inverted input terminal of the operational amplifier U1 and the potential of the non-inverted input terminal (0 due to being grounded) is 0.

In the imaginary short-circuit state, the input power of current in the inverted input terminal of the operational amplifier U1 is 0. Therefore, current I3 flowing in the feedback resistor Rc from the output terminal side of the operational amplifier U1 to the inverted input terminal side is equivalent to current Iin generated by the photodiode PD (Iin=I3). Therefore, the potential V1 on a connection terminal between the resistor Rb and the resistor Ra is Rc×I3=Rc×Iin.

The potential Vout of the output terminal of the operational amplifier U1 is represented in the expression Vout=V1+Rb×I2, using the current I2 flowing from the output terminal to the resistor Rb, the resistor Rb, and the previously described V1. As described above, because the expression V1=Rc×Iin and the expression I2=I1+I3=I1+Iin are true, the expression Vout=Rc×Iin+Rb×(I1+Iin) is true. Additionally, the expression I1=V1/Ra is true. The following expression is also true because the expression V1=Rc×Iin is true as described above.

$$Vout = Rc \times Iin + Rb \times (V1/Ra + Iin)$$
$$= Rc \times Iin + Rb \times (Rc/Ra \times Iin + Iin)$$
$$= Iin \times (Rc \times (1 + Rb/Ra) + Rb)$$

Therefore, the gain (gain) of the TIA circuit 900 is expressed in the following formula (1).

$$Gain = Rc \times (1 + Rb/Ra) + Rb \qquad (1)$$

For example, when Ra=100Ω, Rb=900Ω, and Re=1 MΩ (megaohm, 1 MΩ=$10^6$Ω), the gain of the TIA circuit 900 is calculated as shown in the following formula:

$$Gain = 1 \times 10^6 \times (1 + 900/100) + 900$$
$$= 10^7 + 900$$
$$= 10{,}000{,}900$$

Figure 8:
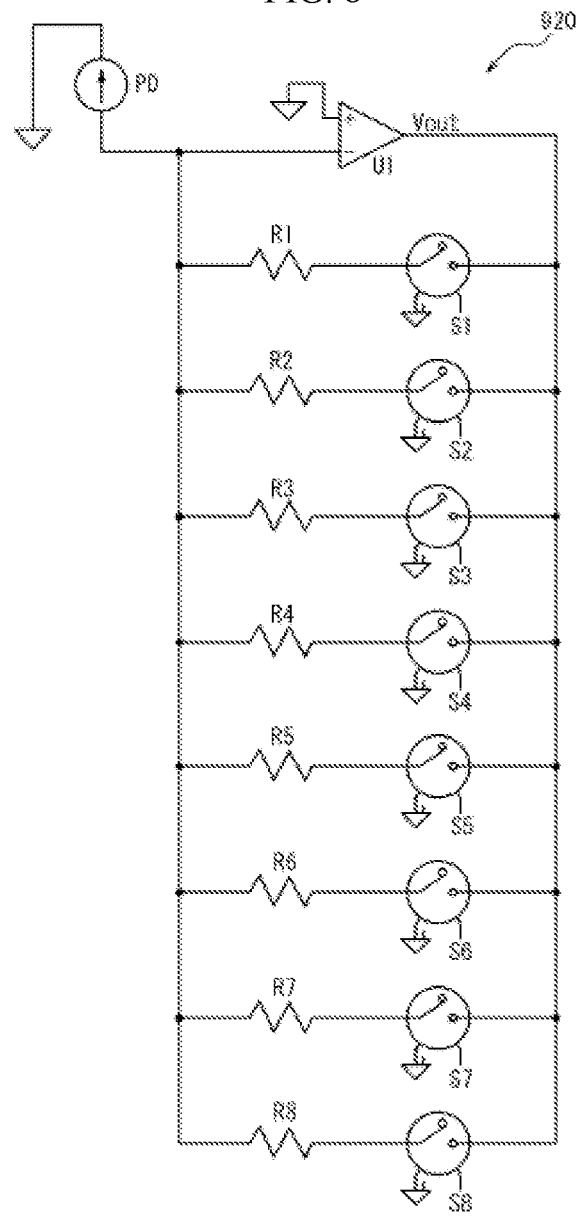
FIG. 8 is a diagram illustrating a configuration example for switching gain by switching a feedback resistor circuit in the transimpedance amplifier of FIG. 7.

FIG. 8 is a diagram illustrating a configuration of an amplifier circuit 920 according to a comparative example wherein a feedback resistor Rc can be switched using a switch in the TIA circuit in FIG. 7, considering that the dynamic range of the output of the photodiode PD is wide. In FIG. 8, the resistors R1 to R8 are connected in series to respectively corresponding switches S1 to S8, and eight sets of resistors and switches respectively connected in series are connected in parallel and carry out a role corresponding to the feedback resistor Rc of the TIA circuit 900 in FIG. 7. The amplifier circuit 920 does not have a configuration corresponding to the voltage-dividing resistors Ra and Rb. In the amplifier circuit 920, R1 is 10 GΩ (Gigaohms, 1 GΩ=$10^9$Ω). R2 is 1 GΩ. R3 is 100 MΩ. R4 is 10 MΩ. R5 is 1 MΩ. R6 is 100 kΩ (kiloohm, 1 kΩ=$10^3$Ω). R7 is 10 kΩ. R8 is 1 kΩ.

According to the magnitude of the current input from the photodiode PD, only one switch corresponding to any one of R1 to R8 is set to ON, and the resistance thereof functions as the feedback resistor Rc. The gain of an amplifier circuit 920 is a value of resistance connected in series to the switch set to ON.

Here, for example, an operation for setting the potential Vout of the output terminal of the operational amplifier U1 to around 1 V regardless of the magnitude of the output current will be described. To do so, when the input current is around 100 pA, only a switch S1 may be turned ON and all other switches may be turned OFF. When the input current is around 1 nA (nanoampere, 1 nA=$10^{-9}$ A), only the switch S2 is turned on and the other switches are turned off. When the input current is around 10 nA, only a switch S3 may be turned ON and all other switches may be turned OFF. When the input current is around 100 nA, only a switch S4 may be turned ON and all other switches may be turned OFF. When the input current is around 1 μA (microamperes, 1 μA=$10^{-6}$ A), only a switch S5 may be turned ON and all other switches may be turned OFF. When the input current is around 10 μA, only a switch S6 may be turned ON and all other switches may be turned OFF. When the input current is around 100 μA, only a switch S7 may be turned ON and all other switches may be turned OFF. When the input current is around 1 mA, only a switch S8 may be turned ON and all other switches may be turned OFF. Therefore, it is possible to handle a wide dynamic range of input current by appropriately switching the switches S1 to S8 ON/OFF according to the magnitude of the input current.

However, resistors having a resistance value that exceeds 10 MΩ are generally extremely expensive because of poor market availability. Particularly in equipment that requires high-accuracy measurements, a high-accuracy resistor is required and more expensive components are demanded. Furthermore, because leakage current is generally discharged in an analog switch, when the plurality of switches S1 to S8 are connected in parallel as illustrated in FIG. 7, the leakage current generated in the switches S1 to S8 accumulates to form a large error current. To measure a minute current such as 100 pA with high accuracy, a leakage current from an analog switch must be limited to a pA scale that is extremely small. Such analog switches are generally expensive. Additionally, because one control signal line must be provided for each analog switch, the circuit configuration becomes more complicated as the number of analog switches increases.

The configuration of an amplifier circuit having a large dynamic range wherein the number of resistors having a resistance that exceeds 10 MΩ, or the number of analog switches discharging a leakage current and that require installation of a signal line can be decreased will be described in one or more embodiments of the present invention.

Figure 1:
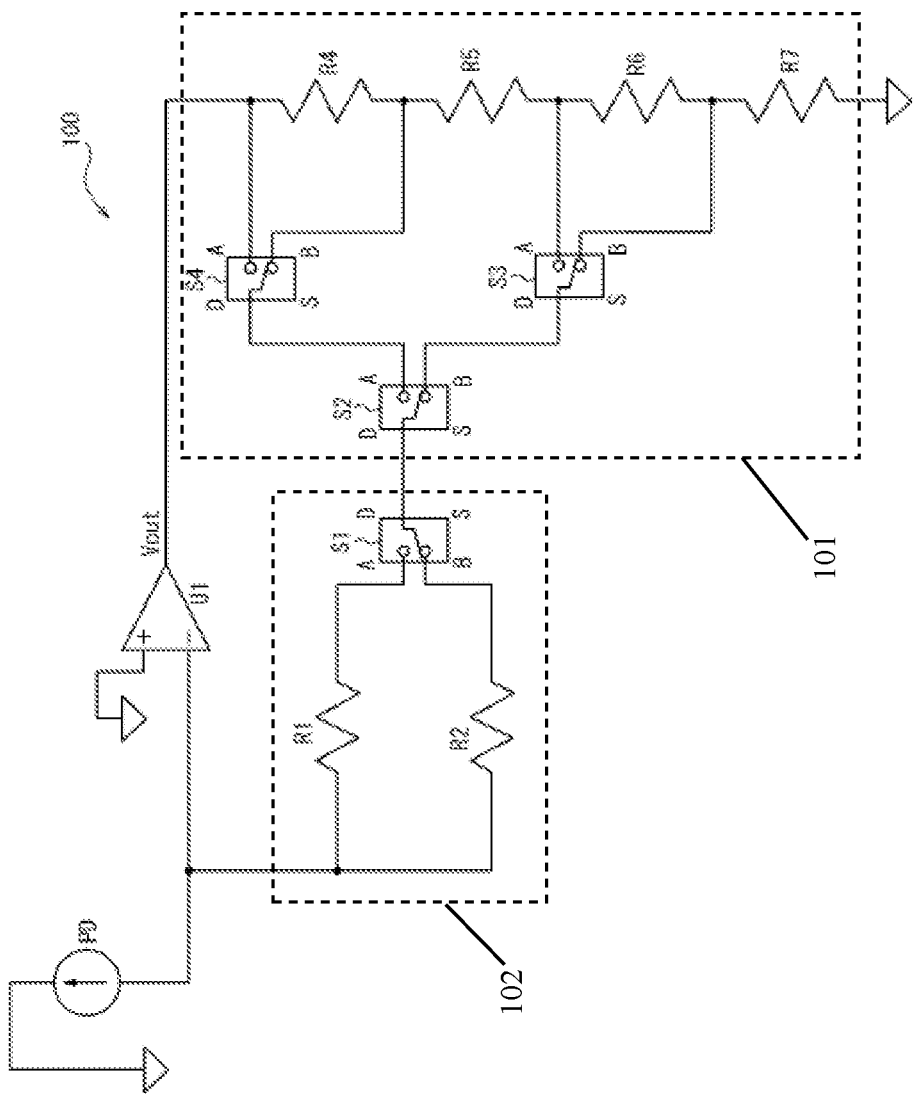
FIG. 1 is a diagram illustrating a configuration example of the amplifier circuit according to one or more embodiments.

FIG. 1 is a diagram illustrating a configuration example of an amplifier circuit 100 according to one or more embodiments. The amplifier circuit 100 includes a voltage-dividing resistor circuit 101, a feedback resistor circuit 102, an operational amplifier U1, and a photodiode PD. The operational amplifier U1 has two input terminals and one output terminal. The voltage-dividing resistor circuit 101 is electrically connected between the output terminal and the ground terminal of the operational amplifier U1, and has a voltage-dividing terminal outputting a potential obtained by voltage-dividing the potential of the output terminal. In the amplifier circuit 100 in FIG. 1, the voltage-dividing resistor circuit 101 includes a resistor R4, a resistor R5, a resistor R6, a resistor R7, a switch S2, a switch S3, and a switch S4. The feedback resistor circuit 102 is electrically connected to the voltage-dividing terminal and one of the input terminals of the operational amplifier U1. In the amplifier circuit 100 in FIG. 1, the feedback resistor circuit 102 includes a resistor R1, a resistor R2, and a switch S1.

The resistor R1 is 10 MΩ. The resistor R2 is 1 kΩ. The resistor R4 is 900Ω. The resistor R5 is 90Ω. The resistor R6 is 9Ω. The resistor R7 is 1Ω. The resistors R1 and R2 are provided in parallel, and both of these have one end connected to an inverted input terminal of the operational amplifier U1 and the other end connected to the switch S1. One end of the switch S1 is made to be the switch S2, and the resistor R1 or the resistor R2 is connected to the switch S2 by a switching operation of the switch S1. The resistor R1 or R2 operates as the feedback resistor circuit 102 described above by switching the switch S1. The feedback resistor circuit 102 selected by switching the switch S1 is hereafter represented by "Rb". The resistance values of the resistors R1, R2, and R4 to R7 described above are simply one example, and other values are also possible.

The resistor R4, the resistor R5, the resistor R6, and the resistor R7 are connected in series in this order. One end of the resistor R4 not connected to the resistor R5 is connected to the output terminal of the operational amplifier U1. One end of the resistor R7 not connected to the resistor R6 is grounded.

One end of the switch S2 described above is connected to the switch S1, and the switch S4 or the switch S3 is connected to the switch S1 by a switching operation of the switch S2. One end of the switch S4 is connected to the switch S2, and either end of the resistor R4 is connected to the switch S2 by a switching operation of the switch S4. One end of the switch S3 is connected to the switch S2, and either end of the resistor R6 is connected to the switch S2 by a switching operation of the switch S3. By switching the switches S2, S3, and S4 in this manner, any of a connection terminal between the operational amplifier U1 and the resistor R4, a connection terminal between the resistors R4 and R5, a connection terminal between the resistors R5 and R6, and a connection terminal between the resistors R6 and R7 is directly electrically connected to the switch S1. That is, the series of resistors R4 to R7 are divided into two by a contact between the resistors directly connected to the switch S1, except when the switch S1 is directly connected to the output terminal of the operational amplifier U1 in accordance with the switching operation of the switch S2-S4, and operate as the partial voltage resistor. Below, the resistance between the voltage-dividing terminal selected by switching the switches S2, S3, and S4 and the ground terminal is represented by "Ra." The resistance between the voltage-dividing terminal and the output terminal of the operational amplifier U1 is represented by "Rb."

FIG. 2 is a diagram illustrating switching details of the switches S1, S2, S3, and S4, and the corresponding relationship between the feedback resistor Rc, the voltage-dividing resistors Ra and Rb, and the gain in the amplifier circuit 100 in FIG. 1. For example, when the range (range) is "1," the switch S1 is set to "B." Therefore, the switch S2 and the resistor R2 (=1 kΩ) are connected via the switch S1, and Rc=1,000Ω. The switch S2 is set as "A." The switch S4 is set to "A." Therefore, from among the voltage-dividing resistors, Ra becomes 1,000Ω (=R4+R5+R6+R7) and Rb becomes 0Ω regardless of the set content of the switch S3. Therefore, the gain is 1,000.

Furthermore, for example, when the range (range) is "7," the switch S1 is set to "A." Therefore, the switch S2 and the resistor R1 (=10 MΩ) are connected via the switch S1, and Rc=10,000,000Ω. The switch S2 is set as "B." The switch S3 is set as "A." Therefore, from among the voltage-dividing resistors, Ra becomes 10Ω (=R6+R7) and Rb becomes 990Ω (=R4+R5) regardless of the set content of the switch S4. Therefore, the gain is 1,000,000,990.

As illustrated in FIG. 2, by switching the switches S1, S2, S3, and S4, the gain of the amplifier circuit 100 can be switched between a wide dynamic range in eight stages: 1 k, 10 k, 100 k, 1 M, 10 M, 100 M, 1 G, and 10 G. The gains shown in FIG. 2 include fractions of "900," "990," or "999," and these fractions can be corrected by calibration so as not to be gain errors. In the example of the amplifier circuit 100, the resistor R1 is the only resistor having a size of 10 MΩ. There are only four switches: S1, S2, S3, and S4. Therefore, the amplifier circuit 100 can realize a wide dynamic range of $10^7$ from the minimum gain to the maximum gain using a small number of high resistors and switches. Moreover, because there is no switch connected in parallel capable of simultaneously conducting in the amplifier circuit 100, leakage current generated in the switches does not accumulate and become a large error current. For example, the switches S3 and S4 are switched by the switch S2. Therefore, the switches S3 and S4 simultaneously conduct to prevent the accumulation of leakage current. Therefore, according to the amplifier circuit 100, an amplifier circuit is provided having a large dynamic range using an inexpensive and simple structure.

As described above, the amplifier circuit 100 includes: an operational amplifier U1 having two input terminals and one output terminal; a voltage-dividing resistor circuit 101 electrically connected to the output terminal of the operational amplifier U1, having a voltage-dividing terminal outputting a potential obtained by voltage-dividing the potential of the output terminal; and a feedback resistor circuit 102 electrically connected to the voltage-dividing terminal and one of the input terminals of the operational amplifier U1. Here, the voltage-dividing resistor circuit 101 includes a plurality of resistors and switches S2 to S4. The switches S2 to S4 are configured to be able to switch between terminals corresponding to voltage-dividing terminals (any terminal of the resistors R4 to R7) from among the plurality of terminals of the plurality of resistors, making it possible to change the voltage-dividing ratio of the voltage-dividing resistor. For example, the switch (e.g., one of the switches S2 to S4) may switch, from a terminal of one of the resistors R4 to R7 to a terminal of another one of resistors R4 to R7, a terminal that corresponds to the voltage-dividing terminal. The gain of the amplifier circuit 100 can be switched using the switches S2 to S4. Therefore, according to the amplifier circuit 100, it is possible to reduce the use of expensive parts, simplify the circuit and the operation control thereof, and reduce the size of the mounting area of the printed circuit board.

Figure 5:
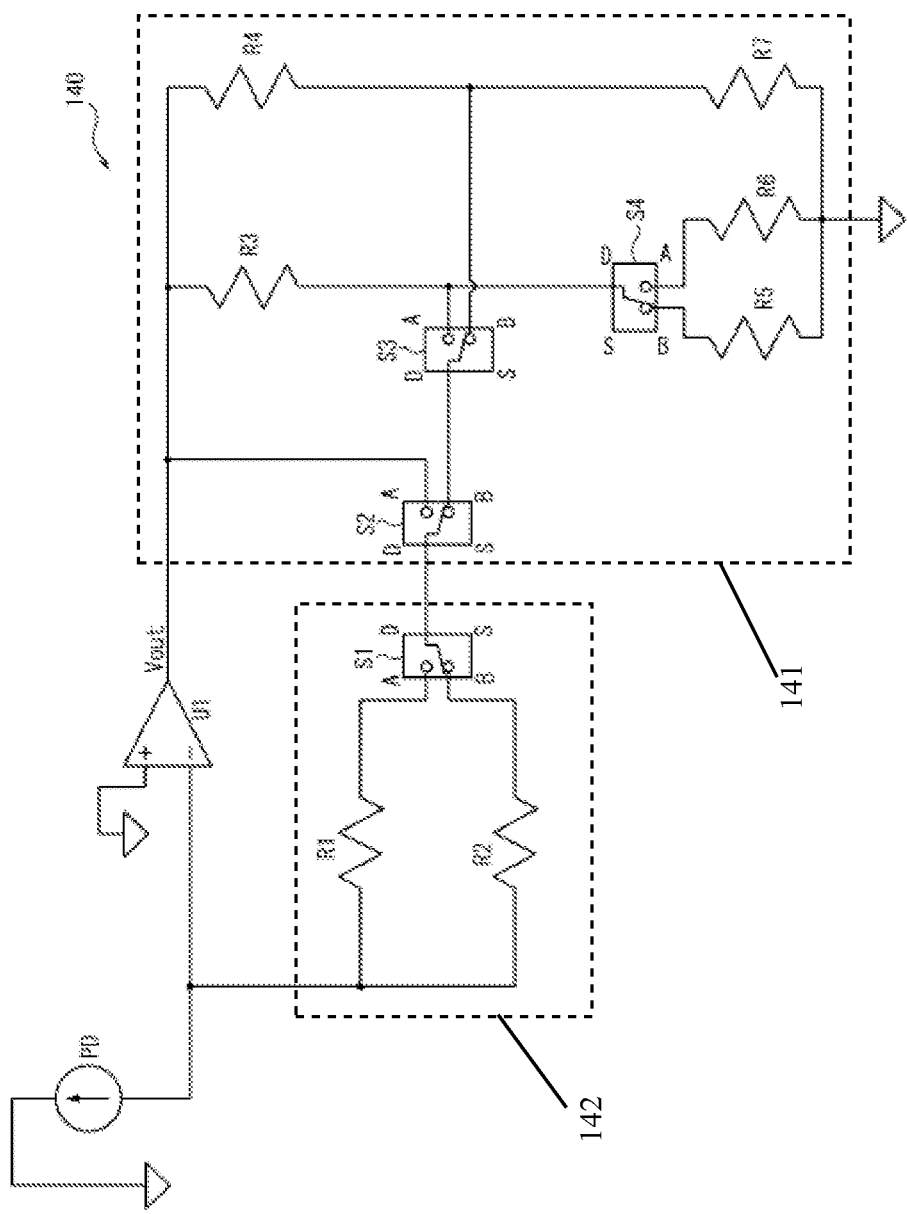
FIG. 5 is a diagram illustrating a configuration example of the amplifier circuit according to one or more embodiments.

Furthermore, in the amplifier circuit 100, the voltage-dividing resistor circuit 101 includes a plurality of switches S2 to S4. At least one of the plurality of switches (for example, the switch S2) can switch between another switch (for example, the switch S3) from among the plurality of switches and another circuit element (for example, the switch S4). In the amplifier circuit 100 in FIG. 1, the switch S2 is connected to the switch S1 and can switch between the two switches S3 and S4. However, the circuit element capable of switching between other switches is not limited to a switch, and may be a terminal or the like connecting a resistor or a plurality of circuit elements. For example, in FIG. 3 which is referred to hereinafter, the switch S4 switches between the switch S3 and the terminal of the resistor R5 not connected to the resistor R6 and connects these to an output terminal of the operational amplifier U1. In FIG. 5 which is referred to hereinafter, the switch S2 switches between the switch S3 and the output terminal of the operational amplifier U1 and connects these to the switch S1. By configuring a switch to switch between configurations including other switches in this manner, the resistance of the voltage-dividing resistor circuit 101 can be switched to various values using a small number of switches.

Furthermore, at least two resistors out of the plurality of resistors provided in the voltage-dividing resistor circuit 101 are connected in series. The plurality of switches can switch between terminals corresponding to voltage-dividing terminals from the connection terminals of at least two resistors. In the amplifier circuit 100, all of the plurality of resistors R3 to R7 provided in the voltage-dividing resistor circuit 101 are connected in series. Therefore, the resistance of the voltage-dividing resistor circuit 101 can be switched based on the resistance of at least two resistors connected in series.

The feedback resistor circuit 102 includes the plurality of resistors R1 and R2, and the switch S1 capable of switching the resistance of the feedback resistor circuit 102. For example, the plurality of resistors R1 and R2 provided in the feedback resistor circuit 102 may be connected in parallel, such as in the amplifier circuit 100. Therefore, the number of, for example, 10 MΩ resistors required to increase the dynamic range of the gain of the amplifier circuit can be suppressed.

Figure 3:
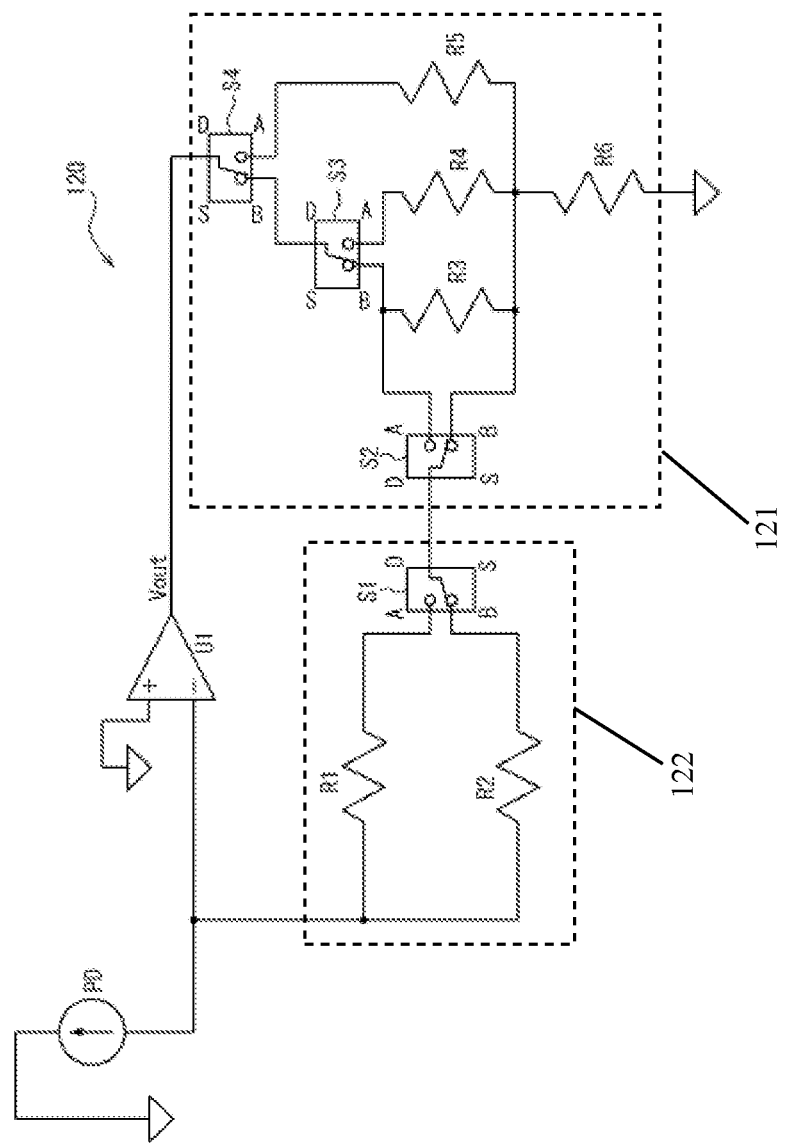
FIG. 3 is a diagram illustrating a configuration example of the amplifier circuit according to one or more embodiments.

In the amplifier circuit 100, all of the plurality of resistors provided in the voltage-dividing resistor circuit 101 are connected in series, but the present disclosure is not limited to this configuration. FIG. 3 is a diagram illustrating a configuration example of an amplifier circuit 120 according to one or more embodiments. The amplifier circuit 120 includes a voltage-dividing resistor 121, a feedback resistor circuit 122, an operational amplifier U1, and a photodiode PD. The feedback resistor circuit 122 includes a resistor R1, a resistor R2, and a switch S1. The voltage-dividing resistor circuit 121 includes a resistor R3, a resistor R4, a resistor R5, a resistor R6, a switch S2, a switch S3, and a switch S4. The resistor R1 in FIG. 3 is 10 MΩ. The resistor R2 is 1 kΩ. The resistor R3 is 900Ω. The resistor R4 is 9.9 kΩ. The resistor R5 is 99.9 kn. The resistor R6 is 100Ω. The fact that the resistor R1 or R2 operates as the feedback resistor Re described above by switching the switch S1 is the same as in the amplifier circuit 100. The resistance values of the resistors R1 to R6 described above are simply one example, and other values are also possible.

The resistor R3, resistor R4, and the resistor R5 in FIG. 3 all have one end connected to the resistor R6. One end of the resistor R6 not connected to the resistors R3 to R5 is grounded.

One end of the switch S2 in FIG. 3 is connected to the switch S1, and either terminal of the resistor R3 is connected to the switch S1 by a switching operation of the switch S2. One end of the switch S3 is connected to the switch S4, and the terminal of either the resistor R3 or the resistor R4 not connected to the resistor R6 is connected to the switch S4 by a switching operation of the switch S3. One end of the switch S4 is connected to the output terminal of the operational amplifier U1, and the terminal of the switch S3 or the resistor R5 not connected to the resistor R6 is connected to the output terminal of the operational amplifier U1 by a switching operation of the switch S4. By switching the switches S2, S3, and S4 in this manner, any of the output terminal of the operational amplifier U1, a connection terminal between the resistors R3 and R6, a connection terminal between the resistors R4 and R6, and a connection terminal between the resistors R5 and R6 is directly electrically connected to the switch S1. That is, the series of resistors R3 to R6 operate as the voltage-dividing resistors Rb and Ra (voltage-dividing resistor circuit) described above.

FIG. 4 is a diagram illustrating switching details of the switches S1, S2, S3, and S4, and the corresponding relationship between the feedback resistor Rc, the voltage-dividing resistors Ra and Rb, and the gain in the amplifier circuit 120 in FIG. 3. For example, when the range (range) is "1," the switch S1 is set to "B." Therefore, the switch S2 and the resistor R2 (=1 kΩ) are connected via the switch S1, and Rc=1,000Ω. The switch S2 is set as "A." The switch S3 is set as "B." The switch S4 is set as "B." Therefore, from among the voltage-dividing resistors, Ra becomes 1,000Ω (=R3+R6) and Rb becomes 0Ω. Therefore, the gain is 1,000.

Furthermore, for example, when the range (range) is "8," the switch S1 is set to "A." Therefore, the switch S2 and the resistor R1 (=10 MΩ) are connected via the switch S1, and Rc=10,000,000Ω. The switch S2 is set as "B." The switch S4 is set as "A." Therefore, from among the voltage-dividing resistors, Ra becomes 100Ω (=R6) and Rb becomes 99,900Ω (=R5) regardless of the set content of the switch S3. Therefore, the gain is 10,000,099,900.

As illustrated in FIG. 4, by switching the switches S1, S2, S3, and S4, the gain of the amplifier circuit 120 can be switched between a wide dynamic range in eight stages: 1 k, 10 k, 100 k, 1 M, 10 M, 100 M, 1 G, and 10 G. The gains shown in FIG. 4 include fractions such as "900," "9,900," or "99,900," and these fractions can be corrected by calibration. In the example of the amplifier circuit 120, the resistor R1 is the only resistor having a size of 10 MΩ. There are only four switches: S1, S2, S3, and S4. Therefore, the amplifier circuit 120 can realize a wide dynamic range of $10^7$ from the minimum gain to the maximum gain using a small number of high resistors and switches. Moreover, because there is no switch connected in parallel capable of simultaneously conducting in the amplifier circuit 120, leakage current generated in the switches does not accumulate and become a large error current. Therefore, according to the amplifier circuit 120, an amplifier circuit is provided having a large dynamic range using an inexpensive and simple structure.

FIG. 5 is a diagram illustrating a configuration example of an amplifier circuit 140 according to one or more embodiments. The amplifier circuit 140 includes a voltage-dividing resistor circuit 141, a feedback resistor circuit 142, an operational amplifier U1, and a photodiode PD. The feedback resistor circuit 142 includes a resistor R1, a resistor R2, and a switch S1. The voltage-dividing resistor circuit 141 includes a resistor R3, a resistor R4, a resistor R5, a resistor R6, a resistor R7, a switch S2, a switch S3, and a switch S4. The resistor R1 in FIG. 5 is 10 MΩ. The resistor R2 is 1 kΩ. The resistor R3 is 990Ω. The resistor R4 is 999Ω. The resistor R5 is 110Ω. The resistor R6 is 10Ω. The resistor R7 is 1Ω. The fact that the resistor R1 or R2 operates as the feedback resistor Re described above by switching the switch S1 is the same as in the amplifier circuit 100 and the amplifier circuit 120. The resistance values of the resistors R1 to R7 described above are simply one example, and other values are also possible.

One end of both the resistor R3 and the resistor R4 in FIG. 5 is connected to the output terminal of the operational amplifier U1. One end of the resistor R3 not connected to the output terminal of the operational amplifier U1 is connected to the switch S4. One end of the resistor R4 not connected to the output terminal of the operational amplifier U1 is connected to the resistor R7. The resistor R5 and the resistor R6 both have one end connected to the switch S4 of the operational amplifier U1 and have the other end grounded. One end of the resistor R7 not connected to the resistor R4 is grounded.

One end of the switch S2 in FIG. 5 is connected to the switch S1, and the output terminal of the operational amplifier U1 or the switch S3 is connected to the switch S1 by a switching operation of the switch S2. One end of the switch S3 is connected to the switch S2, and the connection terminal between the resistor R3 and the switch S4 or the connection terminal between the resistor R4 and the resistor R7 is connected to the switch S2 by a switching operation of the switch S3. One end of the switch S4 is connected to one end of the resistor R3 not connected to the output terminal of the operational amplifier U1, and the resistor R5 or the resistor R6 is connected to one end of the resistor R3 by a switching operation of the switch S4. By switching the switches S2, S3, and S4 in this manner, any of the output terminal of the operational amplifier U1, a connection terminal between the resistors R3 and R5, a connection terminal between the resistors R3 and R6, and a connection terminal between the resistors R4 and R7 is directly electrically connected to the switch S1. That is, the series of resistors R3 to R6 operate as the voltage-dividing resistors Rb and Ra (voltage-dividing resistor circuit) described above.

FIG. 6 is a diagram illustrating switching details of the switches S1, S2, S3, and S4, and the corresponding relationship between the feedback resistor Rc in the amplifier circuit 140, the voltage-dividing resistors Ra and Rb, and the gain in the amplifier circuit 140 in FIG. 5. For example, when the range (range) is "1," the switch S1 is set to "B." Therefore, the switch S2 and the resistor R2 (=1 kΩ) are connected via the switch S1, and Rc=1,000Ω. The switch S2 is set as "A." Therefore, from among the voltage-dividing resistors, although Ra changes based on the set content of the switches S3 and S4, Rb is 0Ω. Therefore, the gain is 1,000.

Furthermore, for example, when the range (range) is "8," the switch S1 is set to "A." Therefore, the switch S2 and the resistor R1 (=10 MΩ) are connected via the switch S1, and Rc=10,000,000Ω. The switch S2 is set as "B." The switch S3 is set as "B." Therefore, from among the voltage-dividing resistors, Ra becomes 1Ω (=R7) and Rb becomes 999Ω (=R4) regardless of the set content of the switch S4. Therefore, the gain is 10,000,000,999.

Therefore, according to the amplifier circuit 140, an amplifier circuit is provided having a large dynamic range using an inexpensive and simple structure.

According to each configuration above, a dynamic range of $10^7$ or more between the minimum gain and the maximum gain can be realized by switching a switch. Switching of the switch may be performed, for example, when the output voltage of the amplifier circuit is input as a digital signal by an ADC to an information processing device or a dedicated unit such as a PC, and the voltage value exceeds or is below a predetermined value. Specifically, the CPU always monitors the output voltage of the amplifier circuit and may switch to the next lower range of gain when the output voltage exceeds an upper limit value, and may switch to the next higher range of gain when the output voltage is lower than a lower limit value. Thus, for example, when the amplifying circuit according to one or more embodiments is applied to a device having a large range of light quantity such as a turbidity meter, the quantity of light can be measured within the range of an optimal voltage without causing saturation or the like. Furthermore, because a wide dynamic range can be handled according to the amplifier circuit described above, an amplifier circuit having the same design can be applied to various products having different range requirements. ADC is an abbreviation for analog-digital converter. PC is an abbreviation for personal computer.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

100 Amplifier circuit
101 Voltage-dividing resistor circuit
102 Feedback resistor circuit
120 Amplifier circuit
121 Voltage-dividing resistor circuit
122 Feedback resistor circuit
140 Amplifier circuit
141 Voltage-dividing resistor circuit
142 Feedback resistor circuit
900 Transimpedance amplifier circuit
920 Amplifier circuit
940 Voltage-dividing resistor circuit
960 Feedback resistor circuit

What is claimed is:

1. An amplifier circuit, comprising:
an operational amplifier that comprises two input terminals and an output terminal;
a voltage-dividing resistor circuit electrically connected to the output terminal and that comprises:
a voltage-dividing terminal that outputs a potential obtained by voltage-dividing a potential of the output terminal; and
a feedback resistor circuit electrically connected to the voltage-dividing terminal and one of the two input terminals, wherein
the voltage-dividing resistor circuit comprises:
a plurality of resistors that each comprise terminals;
a first switch; and
a second switch, and
the first switch switches between the second switch and another circuit element of the amplifier circuit.

2. The amplifier circuit according to claim 1, wherein
the voltage-dividing resistor circuit further comprises a third switch, and
the another circuit element is the third switch.

3. The amplifier circuit according to claim 1, wherein
the plurality of resistors comprises a first resistor and a second resistor, and
the first resistor and the second resistor are connected in series.

4. The amplifier circuit according to claim 1, wherein all of the plurality of resistors are connected in series.

5. The amplifier circuit according to claim 1, wherein the feedback resistor circuit comprises:
a plurality of resistors; and
a switch that switches a resistance of the feedback resistor circuit.

6. The amplifier circuit according to claim 5, wherein all of the plurality of resistors of the feedback resistor circuit are connected in parallel.

7. The amplifier circuit according to claim 2, wherein the feedback resistor circuit comprises:
   a plurality of resistors; and
   a switch that switches a resistance of the feedback resistor circuit.

8. The amplifier circuit according to claim 7, wherein all of the plurality of resistors of the feedback resistor circuit are connected in parallel.

9. The amplifier circuit according to claim 3, wherein the feedback resistor circuit comprises:
   a plurality of resistors; and
   a switch that switches a resistance of the feedback resistor circuit.

10. The amplifier circuit according to claim 9, wherein all of the plurality of resistors of the feedback resistor circuit are connected in parallel.

11. The amplifier circuit according to claim 4, wherein the feedback resistor circuit comprises:
   a plurality of resistors; and
   a switch that switches a resistance of the feedback resistor circuit.

12. The amplifier circuit according to claim 11, wherein all of the plurality of resistors of the feedback resistor circuit are connected in parallel.

\* \* \* \* \*